US008211265B2

(12) United States Patent
Samuels

(10) Patent No.: US 8,211,265 B2
(45) Date of Patent: *Jul. 3, 2012

(54) METHOD FOR PREPARING MULTILAYER STRUCTURES CONTAINING A PERFLUORINATED COPOLYMER RESIN LAYER

(75) Inventor: Sam Louis Samuels, Landenberg, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 151 days.

This patent is subject to a terminal disclaimer.

(21) Appl. No.: 12/795,076

(22) Filed: Jun. 7, 2010

(65) Prior Publication Data

US 2011/0297314 A1 Dec. 8, 2011

(51) Int. Cl.
*B29C 65/00* (2006.01)
*B29C 45/00* (2006.01)
*B29C 47/00* (2006.01)
*B29C 43/02* (2006.01)
*B29C 49/00* (2006.01)
*B29C 51/00* (2006.01)
*B29C 39/14* (2006.01)
*B29C 49/08* (2006.01)
*B29C 55/00* (2006.01)
*B29C 67/20* (2006.01)
*B29C 43/10* (2006.01)
*B31B 1/60* (2006.01)
*B32B 37/00* (2006.01)
*B29D 24/00* (2006.01)
*B29D 29/00* (2006.01)
*B29D 7/00* (2006.01)
*B29B 15/00* (2006.01)

(52) U.S. Cl. ......... 156/285; 156/60; 156/286; 264/511; 264/553; 264/566; 264/568; 264/571

(58) Field of Classification Search ............ 156/60, 156/285, 286; 264/511, 553, 566, 568, 571
See application file for complete search history.

(56) References Cited

U.S. PATENT DOCUMENTS

| | | |
|---|---|---|
| 2,632,921 A | 3/1953 | Kreidl |
| 2,648,097 A | 8/1953 | Kritchever |
| 2,683,894 A | 7/1954 | Kritchever |
| 2,704,382 A | 3/1955 | Kreidl |
| 2,897,183 A | 7/1959 | Christl et al. |
| 3,030,290 A | 4/1962 | Ryan, Jr. |
| 3,234,062 A | 2/1966 | Morris |
| 3,350,372 A | 10/1967 | Anspon et al. |
| 3,404,134 A | 10/1968 | Rees |
| 3,676,181 A | 7/1972 | Kowalewski |
| 3,756,996 A | 9/1973 | Pugh et al. |
| 3,852,136 A | 12/1974 | Plumat et al. |
| 4,029,868 A | 6/1977 | Carlson |
| 4,341,576 A | 7/1982 | Lewis |
| 4,351,931 A | 9/1982 | Armitage |
| 4,385,951 A | 5/1983 | Pressau |
| 4,398,979 A | 8/1983 | Cathers et al. |
| 4,732,814 A | 3/1988 | Hatada et al. |
| 5,028,674 A | 7/1991 | Hatch et al. |
| 5,415,909 A | 5/1995 | Shohi et al. |
| 5,532,066 A | 7/1996 | Latiolais et al. |
| 5,536,347 A | 7/1996 | Moran |
| 5,583,057 A | 12/1996 | Inoue |
| 5,677,404 A | 10/1997 | Blair |
| 5,853,516 A | 12/1998 | Lehto |
| 6,075,202 A * | 6/2000 | Mori et al. ............... 136/251 |
| 6,204,443 B1 | 3/2001 | Kiso et al. |
| 6,320,115 B1 | 11/2001 | Kataoka et al. |
| 6,323,416 B1 | 11/2001 | Komori et al. |
| 6,342,116 B1 | 1/2002 | Balduin et al. |
| 6,414,236 B1 * | 7/2002 | Kataoka et al. ........... 136/251 |
| 6,521,825 B2 | 2/2003 | Miura et al. |
| 6,541,588 B1 | 4/2003 | Kaulbach et al. |
| 6,726,979 B2 | 4/2004 | Friedman et al. |
| 6,753,087 B2 * | 6/2004 | Jing et al. ................ 428/421 |
| 6,762,508 B1 | 7/2004 | Kiso et al. |
| 6,818,819 B2 | 11/2004 | Morizane et al. |
| 6,963,120 B2 | 11/2005 | Shiozaki et al. |
| 6,972,068 B1 | 12/2005 | Kobayashi et al. |
| 7,638,186 B2 | 12/2009 | Hull et al. |
| 2004/0182493 A1 | 9/2004 | Chick |
| 2007/0267059 A1 | 11/2007 | Nishijima et al. |
| 2007/0292685 A1 | 12/2007 | Brothers et al. |
| 2008/0023063 A1 * | 1/2008 | Hayes et al. ............. 136/251 |
| 2008/0023064 A1 | 1/2008 | Hayes et al. |
| 2008/0169023 A1 | 7/2008 | Nishijima et al. |

(Continued)

FOREIGN PATENT DOCUMENTS

CA 2388107 A1 5/2001

(Continued)

OTHER PUBLICATIONS

McDermott et al, "Tetrafluoroethylene Hexafluoropropylene Copolymer Modified With Perfluoropropyl Vinyl Ether", US Statutory Invention Registration, Sep. 2, 1986; Reg. Number H130.
Chou et al, "High Flexibility EMA Made From High Pressure Tubular Process", 60$^{th}$ Annual Technical Conference-Society of Plastic Engineers, 2002; vol. 2, 1832-1836.
Pern et al, Adhesion Strength Study of EVA Encapsulants on Glass Substrates, National Center for Photovoltaics and Solar Program Review Meeting Mar. 24-26, 2003; May 2003, NREL/CD-520-33586, p. 942.
U.S. Appl. No. 12/795,052, "Method for Preparing Transparent Multilayer Film Structures Having a Perfluorinated Copolymer Resin Layer", filed Jun. 7, 2010.

*Primary Examiner* — Christopher Schatz
*Assistant Examiner* — Matthew Hoover

(57) ABSTRACT

Disclosed is a method for preparing a multilayer film laminate having a first layer comprising a perfluorinated copolymer resin layer adhered to a second layer comprising an olefin ester copolymer that has been blended with an organosilane. The multilayer laminate is useful in photovoltaic modules. Methods for preparing photovoltaic modules are also included.

16 Claims, No Drawings

U.S. PATENT DOCUMENTS

| | | |
|---|---|---|
| 2008/0264471 A1 | 10/2008 | Hayes |
| 2008/0264481 A1 | 10/2008 | Hayes |
| 2009/0120489 A1 | 5/2009 | Nishijima et al. |
| 2009/0151772 A1* | 6/2009 | Hayes et al. .................. 136/251 |
| 2009/0183773 A1 | 7/2009 | Samuels et al. |
| 2009/0255571 A1 | 10/2009 | Xia et al. |
| 2011/0023943 A1 | 2/2011 | Prejean |

FOREIGN PATENT DOCUMENTS

| | | |
|---|---|---|
| EP | 0577985 B1 | 2/1997 |
| EP | 0769818 A2 | 4/1997 |
| EP | 1065731 A2 | 1/2001 |
| EP | 1182710 A1 | 2/2002 |
| FR | 2539419 A1 | 3/1987 |
| JP | 2000186114 A | 7/2000 |
| JP | 2001144313 | 5/2001 |
| JP | 2004031445 | 1/2004 |
| JP | 2004058583 | 2/2004 |
| JP | 2006032308 | 2/2006 |
| JP | 2006190867 | 7/2006 |
| WO | 9101880 A1 | 2/1991 |
| WO | 03057478 A1 | 7/2003 |
| WO | 2004019421 A1 | 3/2004 |
| WO | 2009/085683 A2 | 7/2009 |

* cited by examiner

METHOD FOR PREPARING MULTILAYER STRUCTURES CONTAINING A PERFLUORINATED COPOLYMER RESIN LAYER

FIELD OF THE INVENTION

The present invention is directed to a method for preparing multilayer films that comprise a layer consisting essentially of a perfluorinated copolymer resin. The invention is further directed to photovoltaic modules that comprise the multilayer films.

BACKGROUND OF THE INVENTION

Photovoltaic (PV) modules (also known as solar modules) are used to produce electrical energy from sunlight, offering an environmentally friendly alternative to traditional methods of electricity generation. Such modules are based on a variety of semiconductor cell systems that can absorb light and convert it into electrical energy and are typically categorized into one of two types of modules based on the light absorbing material used, i.e., bulk or wafer-based modules and thin film modules. Generally, individual cells are electrically connected in an array to form a module, and such an array of modules can be connected together in a single installation to provide a desired amount of electricity.

When the light absorbing semiconductor material in each cell, and the electrical components used to transfer the electrical energy produced by the cells are suitably protected from the environment, photovoltaic modules can last 25, 30, and even 40 or more years without significant degradation in performance. In a typical photovoltaic module construction, the solar cell layer is sandwiched between two encapsulant layers, which layers are further sandwiched between frontsheet and backsheet layers, providing weather resistance, UV resistance, moisture barrier properties, low dielectric constant, and high breakdown voltage.

Fluoropolymer films are recognized as useful components in photovoltaic modules due to their excellent strength, weather resistance, UV resistance, moisture barrier properties, low dielectric constant, and high breakdown voltage and can play a role in both wafer-based and thin film modules. For example, fluoropolymer films, such as an ethylene-tetrafluoroethylene copolymer (ETFE) films, may be used as frontsheets in photovoltaic modules instead of the more common glass layer. Challenges associated with using a fluoropolymer film as a frontsheet include providing the desired combination of barrier properties and transparency, as well as providing good adhesion to an adjacent encapsulant layer. For instance, higher transparency will improve solar module efficiency in converting sunlight into electricity, but achieving higher transparency typically requires the use of thinner fluoropolymer films, which reduces strength, weather resistance, UV resistance, and moisture barrier properties. Furthermore, the reduced barrier properties of thinner films can result in more rapid degradation of the encapsulant layer, reducing the overall performance of the module. ETFE films have become the most widely used fluoropolymer materials for manufacture of PV frontsheets due to the excellent adhesion of ETFE to ethylene vinyl acetate copolymers (EVA) which are the most commonly used material for encapsulant layers.

EVA copolymers have been favored encapsulant materials because they are characterized by low melting temperatures, which allows them to readily flow around and seal the solar cell components. However, the low melting temperature properties of EVA copolymers generally necessitate subsequent crosslinking of the polymer so as to impart suitable thermal stability to the resultant photocells. Therefore, alternative materials that exhibit higher thermal dimensional stability without crosslinking have been developed for use in encapsulant layers.

In addition, encapsulant materials have been compounded with silane coupling agents to improve adhesion to fluoropolymer layers. (See U.S. Pat. Nos. 6,963,120 and 6,762,508; U.S. Patent Application Publications 2009/0183773, 2009/0120489, 2009/0255571, 2008/0169023, 2008/0023063, 2008/0023064 and 2007/0267059; U.S. Patent Application No. 61/230,238; European Patent Application 1065731; French Patent 2539419 and Japanese Patent Applications 2000/186114, 2001/144313, 2004/031445, 2004/058583, 2006/032308 and 2006/1690867).

U.S. Pat. No. 6,753,087 discloses a multilayer structure including a fluoropolymer bonded to a substrate. The structure is prepared by treating a surface of the fluoropolymer with a bonding composition that includes an amino-substituted organosilane, contacting a substrate with the treated surface of the fluoropolymer and heating to form a bond. U.S. Patent Application Publications 2008/0023063, 2008/0023064, 2008/0264471 and 2008/0264481 describe solar cells in which one or both surfaces of any of the solar cell laminate layers may be treated with a silane that incorporates an amine function.

U.S. Pat. No. 7,638,186 and European Patent Application Publication EP577985 disclose the use of tetrafluorethylene-hexafluoropropylene copolymers, commonly referred to as FEP, as back sheet layers in photovoltaic modules. PCT Patent Application Publication WO2004/019421 discloses FEP used as a front sheet layer in photovoltaic modules.

Alternatives to ETFE films that exhibit higher transparency and/or better barrier properties would be desirable, particularly for use in flexible solar cell modules where the use of rigid glass is not feasible. Additionally, the alternative materials would desirably have adequate adhesion to encapsulant materials under adverse conditions to enable their use in photovoltaic modules.

SUMMARY OF THE INVENTION

The present invention provides a method for preparing a transparent multilayer film laminate comprising at least a first film layer and a second film layer, the method comprising:
A. providing a first film layer comprising a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;
B. providing a second film layer comprising a polymeric material comprising a blend of i) an organosilane and ii) a copolymer comprising copolymerized units of an α-olefin and an ethylenically unsaturated carboxylic acid ester;
C. contacting a surface of the second film layer with the modified surface of the first film layer; and
D. adhering the first film layer to the second film layer by the application of heat and optionally pressure or vacuum to form a multilayer film laminate;
wherein the multilayer film laminate is characterized by (i) having an average peel strength between the first film layer and the second film layer of greater than 2 lbf/in, measured after exposing the multilayer film laminate to conditions of 85° C. and 85% relative humidity for 1000 hours; and (ii)

having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical.

The transparent multilayer film may be used as an integrated frontsheet for preparation of a photovoltaic module.

Accordingly, the invention is further directed to a method for preparing a photovoltaic module, the method comprising the steps:
A. providing a solar cell layer;
B. providing a transparent multilayer film laminate that is larger in area than the solar cell layer, the multilayer film laminate comprising at least a first film layer and a second film layer, wherein;
  1. the first film layer comprises a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;
  2. the second film layer comprises a polymeric material comprising a blend of i) an organosilane and ii) a copolymer comprising copolymerized units of an α-olefin and an ethylenically unsaturated carboxylic acid ester; and
  3. wherein the multilayer film laminate is characterized by (i) having an average peel strength between the first film layer and the second film layer of greater than 2 lbf/in, measured after exposing the multilayer film laminate to conditions of 85° C. and 85% relative humidity for 1000 hours; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical;
C. overlaying the solar cell layer with the multilayer film laminate such that
  1. a surface of the second film layer of the multilayer film laminate contacts the solar cell layer;
  2. a portion of the second film layer of the multilayer film laminate extends beyond the perimeter of the solar cell layer; and
  3. the portion of the second film layer of the multilayer film laminate that extends beyond the perimeter of the solar cell layer contacts another layer that is an encapsulant layer; and
D. adhering the second film layer of the multilayer film laminate to the solar cell layer and the encapsulant layer by the application of heat and optionally pressure or vacuum to provide a photovoltaic module.

The invention also provides a method for preparing a photovoltaic module in one lamination operation. That is, the invention provides a method for preparing a photovoltaic module comprising a multilayer laminate, the method comprising the steps:
A. providing a solar cell layer;
B. providing a first film layer comprising a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;
C. providing a second film layer having an upper and lower surface, the second film layer being larger in area than the solar cell layer, wherein the second film layer comprises a polymeric material comprising a blend of i) an organosilane and ii) a copolymer comprising copolymerized units of an α-olefin and an ethylenically unsaturated carboxylic acid ester;
D. contacting a modified surface of the first film layer with the upper surface of the second film layer;
E. contacting the solar cell layer with the second film layer such that
  1. the lower surface of the second film layer contacts the solar cell layer;
  2. a portion of the second film layer extends beyond the perimeter of the solar cell layer; and
  3. the portion of the second film layer that extends beyond the perimeter of the solar cell layer contacts another layer that is an encapsulant layer; and
F. adhering the second film layer to the first film layer and to the encapsulant layer by the application of heat and optionally pressure or vacuum to provide a photovoltaic module;

wherein the multilayer film laminate is characterized by (i) having an average peel strength between the first film layer and the second film layer of greater than 2 lbf/in, measured after exposing the multilayer film laminate to conditions of 85° C. and 85% relative humidity for 1000 hours with the proviso that when the encapsulant layer comprises an ethylene vinyl acetate copolymer, the multilayer film laminate is maintained at a sufficient temperature for a time sufficient to crosslink the ethylene vinyl acetate copolymer prior to exposing the multilayer film laminate to conditions of 85° C. and 85% relative humidity for 1000 hours; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical.

DETAILED DESCRIPTION

The following definitions are used herein to further define and describe the disclosure.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the terms "a" and "an" include the concepts of "at least one" and "one or more than one".

Unless stated otherwise, all percentages, parts, ratios, etc., are by weight.

When the term "about" is used in describing a value or an end-point of a range, the disclosure should be understood to include the specific value or end-point referred to.

In this application, the terms "sheet", "layer" and "film" are used in their broad sense interchangeably. A "frontsheet" is a sheet, layer or film positioned as the outermost layer on the side of a photovoltaic module that faces a light source and may also be described as an incident layer. Because of its location, it is generally desirable that the frontsheet has high transparency to the desired incident light. It is also desirable that the frontsheet has high moisture barrier properties to prevent entry of moisture into the photovoltaic module. Such moisture intrusion can degrade the photovoltaic module components and/or reduce the electrical efficiency of the module. A "backsheet" is a sheet, layer or film on the side of a photovoltaic module that faces away from a light source, and is often opaque. In some instances, it may be desirable to receive light from both sides of a device (e.g. a bifacial device), in which case a module may have transparent layers on both sides of the device "Encapsulant" layers are used to encase the fragile voltage-generating solar cell layer to protect it from damage and hold it in place in the photovoltaic module and are normally positioned between the solar cell layer and the incident layer and the backing layer. Suitable polymer materials for these encapsulant layers typically possess a combination of characteristics such as high transparency, high impact resistance, high penetration resistance, high moisture resistance, good ultraviolet (UV) light resistance, good long term thermal stability, adequate adhesion strength to frontsheets, backsheets, and other rigid polymeric sheets and cell surfaces, and good long term weatherability.

An "integrated frontsheet" is a sheet, layer or film that combines an incident layer and an encapsulant layer. An "integrated backsheet" is a sheet, layer or film that combines a backing layer and an encapsulant layer.

The terms "transparency" and "transparent" as used herein refer to the amount of light that can pass through or be transmitted through a material, compared to the light transmitted through air. "Light transmission level" as used herein is the percentage of light transmitted through a material compared to that transmitted through air.

Increased light transmission for front sheet constructions is desirable for increasing the amount of incident sunlight that reaches the solar cell layer. This enables improved efficiency of photovoltaic modules by allowing more solar energy to be available for conversion to electrical energy by the solar cells.

The term "copolymer" is used herein to refer to polymers containing copolymerized units of two different monomers (i.e. a dipolymer), or more than two different monomers.

The present invention is directed to improved fluoropolymer film laminates that have excellent transparency (i.e. light transmission) and adhesion and that exhibit physical property advantages compared to ETFE film laminates currently used in photovoltaic module applications.

Alternatives to ETFE films that exhibit higher transparency and/or better barrier properties are desirable, particularly for use in flexible solar cell modules where the use of rigid glass is not feasible. One alternative is a film made from a perfluorinated copolymer resin such as a tetrafluoroethylene-hexafluoropropylene copolymer (FEP). However, adhesion of FEP to common materials used in encapsulant layers of photovoltaic modules is significantly poorer than adhesion of ETFE to such materials. Thus, it would be desirable to find methods for preparing multilayer films and integrated front sheets for photovoltaic modules that provide improved adhesion between a perfluorinated copolymer resin layer and encapsulant materials, particularly under adverse conditions.

Organosilane coupling agents have been used in the past to improve adhesion between compositions used as encapsulant materials and various materials used in incident layers of photovoltaic modules. For example, ethylene/vinyl acetate (EVA) copolymer compositions used in photovoltaic module encapsulant layers generally include an organosilane coupling agent such as γ-methacryloxypropyltrimethoxysilane to facilitate bonding to other materials. See "Adhesion Strength Study of EVA Encapsulants on Glass Substrates" F. J. Pern and S. H. Glick, NCPV and Solar Program Review Meeting 2003 NREL/CD-520-33586, Page 942. However, EVA compositions that contain such incorporated silane coupling agents do not have sufficient adhesion under adverse conditions to perfluorinated copolymer resin films, such as FEP films, to allow for the use of FEP in photovoltaic modules.

Thus, it would be desirable to find methods for preparing multilayer films and integrated front sheets for photovoltaic modules that provide improved adhesion between a perfluorinated copolymer resin layer and encapsulant materials, particularly under adverse conditions.

It has surprisingly been found that olefin ester copolymer compositions modified by blending with organosilane coupling agents, especially aminosilanes, where the olefin ester copolymer is a copolymer comprising copolymerized units of an α-olefin and an ethylenically unsaturated carboxylic acid ester (an "ester copolymer"), have significantly enhanced adhesion to perfluorinated copolymer resin films compared to similar films made from compositions without the silane coupling agent.

The process of the present invention is directed to a method for providing a transparent multilayer polymeric film laminate that is particularly suited for use in photovoltaic modules. The laminate comprises a film layer that consists essentially of a perfluorinated copolymer resin. This layer can be directly adhered to a second film layer that comprises a blend of an organosilane and an olefin ester copolymer. The laminate of perfluorinated copolymer resin film and adhered organosilane modified olefin ester copolymer film has good adhesion properties and substantially enhanced transparency compared to similar laminates wherein a fluoropolymer that is not perfluorinated is utilized as a laminate film layer.

The method can be used to form a weatherable multilayer film laminate that has an unusual combination of high adhesivity and excellent transparency. A weatherable multilayer film is a film in which the individual layers are well adhered to each other, such that the peel strength between the layers is greater than 2 lbf/in after exposure to 1000 hours of damp heat (85° C./85% relative humidity) as described in the test methods below.

In addition, it has been found that when the aminosilane-treated film materials described above are adhered to films of surface-modified perfluorinated copolymer resins, transparency is improved compared to similarly-constructed laminates that contain films comprising non-perfluorinated copolymer resins, such as corona-treated ETFE, specifically ETFE that has been corona-treated on one side, such as the film designated PV3251 available from E. I. du Pont de Nemours and Company. This property relates to solar radiation transmittance.

Multilayer films prepared by the process of the invention are characterized by having a light transmission level that exceeds that of a comparison standard laminate wherein an ethylene tetrafluoroethylene copolymer resin layer replaces the FEP layer in the multilayer film laminate. Thus, when a multilayer film laminate construction is prepared according to the process of the invention and the first film layer is a surface-modified perfluorinated copolymer resin, the light transmission level as determined according to ASTM E424 of the laminate exceeds that of an otherwise identical comparison standard multilayer film laminate construction where the fluoropolymer component of the first film layer is corona-treated ETFE, the multilayer film laminates otherwise being identical in chemical composition and laminate structure, including film layer thickness.

The unique combination of the specific perfluorinated copolymer resin and organosilane modified ester copolymer provides substantially enhanced transparency and adhesion properties in the resultant film laminate, making it suitable for use in photovoltaic modules.

Briefly, the method for preparation of the transparent multilayer film laminate comprises the steps of providing a first film layer that comprises a perfluorinated copolymer resin that consists essentially of copolymerized perfluorinated comonomer units; providing a second polymeric film layer that comprises a blend of an organosilane and an olefin ester polymer; and adhering the film layers to form a multilayer film laminate.

The first film layer of the multilayer film laminate prepared by the process of the invention comprises a fluorinated copolymer resin. The fluorinated copolymer resin component consists essentially of a perfluorinated copolymer. That is, the copolymer consists essentially of copolymerized monomer units wherein each monomer unit is a perfluorinated monomer. Suitable fluorinated copolymer resin components of the first layer are tetrafluoroethylene (TFE) copolymers. That is, the polymer component will contain copolymerized units of tetrafluoroethylene and additional copolymerized monomers that are selected from other perfluorinated comonomers.

By perfluorinated comonomer (or comonomers) it is meant that all monovalent atoms that are bonded to the carbon atoms of the particular monomer are fluorine atoms. Examples of perfluorinated (co)monomers include perfluoroolefins having 3 to 8 carbon atoms, such as hexafluoropropylene (HFP). Also suitable for use in the process of the invention are perfluorinated ether monomers, such as perfluoro(alkyl vinyl ethers) (PAVE) in which the linear or branched alkyl groups contain 1 to 5 carbon atoms. Preferred PAVE monomers are those in which the alkyl group contains 1, 2, 3 or 4 carbon atoms, respectively known as perfluoro(methyl vinyl ether) (PMVE), perfluoro(ethyl vinyl ether) (PEVE), perfluoro(propyl vinyl ether) (PPVE), and perfluoro(butyl vinyl ether) (PBVE).

The fluorinated copolymer resin component may be a perfluorinated dipolymer resin, such as a copolymer of TFE and HFP. It may also be a higher order copolymer, such as a terpolymer of TFE and two PAVE, for example. Commercially available perfluorinated copolymer resins of this latter type include TFE/perfluoro(methyl vinyl ether)/perfluoro(propyl vinyl ether) copolymers, sometimes referred to in the art as MFA. TFE/PAVE copolymers are most commonly referred to as PFA. They typically contain at least about 1 weight % copolymerized PAVE units. This includes those copolymers where the PAVE is PPVE or PEVE. Such copolymers will typically contain about 1 to 15 weight % copolymerized PAVE units. When a mixture of PAVE is used that includes PMVE and PPVE, the perfluorinated copolymer resin generally contains about 0.5 to 13 weight % copolymerized perfluoro(methyl vinyl ether) units and about 0.5 to 3 weight % copolymerized PPVE units, the remainder being TFE and bringing the total amount of copolymerized units to 100 weight %.

The perfluorinated copolymer resin of the first film layer consists essentially of a perfluorinated copolymer. That is, the copolymer may contain small percentages of copolymerized units of non-perfluorinated or non-fluorinated comonomers or non-perfluorinated or non-fluorinated end groups, generally below 3 weight percent, preferably below 1 weight percent, and most preferably below 0.5 weight percent, so long as the basic and novel characteristics of the multilayer film laminate formed by the process of the invention are not materially affected. These basic and novel characteristics include transparency and adhesivity, more fully described herein. In addition, if non-fluorinated monomers are present as copolymerized units, the amount of such monomers should be limited so that the copolymer retains desirable perfluoropolymer properties, i.e., weather resistance, solvent resistance and barrier properties. In certain embodiments, the perfluorinated copolymer resin is a copolymer of fluoroolefins and fluorinated vinyl ethers. Atoms other than fluorine and carbon may be present in the copolymer end groups, i.e. the groups that terminate the polymer chains.

The perfluorinated copolymer resins used herein are those that are melt-fabricable, i.e. when in the molten state they flow to an extent such that they can be fabricated by melt processing such as extrusion, to produce products having sufficient strength so as to be useful. The melt flow rate (MFR) of the perfluorinated copolymer resins is preferably at least about 5 g/10 minutes, more preferably at least about 10 g/10 minutes, still more preferably at least about 15 g/10 minutes, even more preferably at least about 20 g/10 minutes, and most preferably, at least 26 g/10 minutes, as measured according to ASTM D-1238 at the temperature and load which are standard for the resin (see for example ASTM D 2116-91a and ASTM D 3307-93).

Tetrafluorethylene-hexafluoropropylene copolymers (FEP) are preferred perfluorinated copolymer resins. The term "FEP copolymers" refers to copolymerized comonomers of tetrafluoroethylene (TFE) and hexafluoropropylene (HFP), optionally with any number of additional monomer units so as to form dipolymers, terpolymers, tetrapolymers and higher order copolymers.

In such copolymers, the copolymerized HFP content is typically about 6-17 wt %, preferably 9-17 wt % (calculated by multiplying HFPI by 3.2). HFPI (HFP Index) is the ratio of infrared radiation (IR) absorbances at specified IR wavelengths as disclosed in U.S. Statutory Invention Registration H130. Preferably, the TFE/HFP copolymer includes a small amount of additional comonomer to improve properties. The FEP copolymer can be TFE/HFP/perfluoro(alkyl vinyl ether) (PAVE), wherein the alkyl group contains 1 to 4 carbon atoms such as PEVE or PPVE. A preferred TFE/HFP copolymer is TFE/HFP/PAVE such as PEVE or PPVE, wherein the HFP content is about 6-17 wt %, preferably 9-17 wt % and the PAVE content, preferably PEVE, is about 0.2 to 3 wt %, the remainder being TFE to total 100 wt % of the copolymer.

Examples of useful FEP compositions are disclosed in U.S. Pat. Nos. 4,029,868; 5,677,404; and 6,541,588; US Patent Application Publication 2007/292685 and in US Statutory Invention Registration H130. The FEP may be partially crystalline. That is, it is not an elastomer. By partially crystalline is meant that the polymers have some crystallinity and are characterized by a detectable melting point measured according to ASTM D 3418, and a melting endotherm of at least about 3 J/g.

Of note are terpolymers containing copolymerized units of HFP (about 6 to 10 weight %), less than 2 weight % copolymerized units of perfluoroethylvinylether PEVE (about 1.5 to 2 weight %), the remainder being copolymerized units of TFE. One example is a perfluorinated copolymer having 7.2 to 8.1 weight % copolymerized units of HFP, 1.5 to 1.8 weight % copolymerized units of PEVE and 90.1 to 91.3 weight % copolymerized units of TFE, the copolymer having a nominal melt flow rate (MFR) of 6 to 8 gm/10 min as defined in ASTM D2116 and melting point 260° C. to 270° C.

The first film layer of the multilayer film laminate useful in the process of the invention comprises the perfluorinated copolymer resin. It may also include other components that do not adversely affect transparency and adhesion of the copolymer resin. For example, additives such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), dispersants, surfactants, chelating agents, coupling agents, reinforcement additives (e.g., glass fiber), and fillers may be present in the first film layer. Generally, such additives are present in amounts of up to 20 weight percent of the first film layer composition, based on the weight of the total composition of the first film layer. In many embodiments, no more than 10 weight percent additives are present. In other embodiments less than 2 weight percent additives are present.

Transparent perfluorinated copolymer film layers suitable for use in the process of the invention may be formed by any technique known to those skilled in the art. For example, the films may be extrusion cast and optionally stretched and heat stabilized. Desirably, the perfluorinated copolymer resin film is oriented to provide improved properties, such as improved toughness and tensile strength.

The transparent perfluorinated copolymer resin film can have a thickness in the range of about 25 to 200 microns, or about 50 to 150 microns, or about 50 to 125 microns and a transmission of greater than about 90%, or greater than about 94%, or greater than about 97% in the visible region of the electromagnetic spectrum, where the visible region of the electromagnetic spectrum is defined as from 380 to 780 nm. High transparency may also be observed in regions of the electromagnetic spectrum beyond the visible region such as between 350 to 800 nm or higher.

The transparent perfluorinated copolymer resin films suitable for use in the process of the invention are those that have been subjected to a surface treatment prior to lamination to the second film layer. This surface treatment modifies the surface of the film and may take any form known within the art, including flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, chemical treatments, chromic acid treatments, hot air treatments, ozone treatments, ultraviolet light treatments, sand blast treatments, solvent treatments, and combinations of two or more thereof. A notable surface treatment is corona treatment (see, e.g. U.S. Pat. Nos. 3,030,290; 3,676,181; 6,726,979; and 6,972,068). Corona treatment can include use of reactive hydrocarbon vapors or other vapors such as ketones, for example, acetone and methyl vinyl ketone; alcohols, for example, methyl alcohol; p-chlorostyrene; acrylonitrile; anhydrous ammonia; amines, for example, propylene diamine, tetraethylene pentamine, cyclohexyl amine, decylamine, diethylene triamine, tertiary butylamine, ethylene diamine, triethylene tetraamine, triethylamine, and methylisopropyl amine; styrene sulfonic acid; carbon tetrachloride; tetraisopropyl titanate; tetrahydrofuran; toluene-2,4-diisocyanate; glycidyl methacrylate; hexane, methyl alcohol, vinyl acetate, vinyl butyl ether, methyl methacrylate, 2-vinyl pyrrolidone, xylene or mixtures thereof.

When the film is surface-treated, the resulting chemical or physical modification of the perfluorinated copolymer resin or of the film surface provides a modified first film layer surface. The modified perfluorinated copolymer surface makes it more amenable to further treatment, for example by providing improved adhesion to other materials. Without being tied to any specific mechanism or theory, the surface treatment may create polar functionalization and/or increased surface energy of the surface.

FEP films surface-treated as described above, such as the grade designated PV3151 commercially available from E. I. du Pont de Nemours and Company, are suitable for use in this invention.

In addition to corona treatment, the perfluorinated copolymer resin film may also be surface-treated with an aminosilane coupling agent. Such surface treatment may be conducted according to methods described in copending U.S. patent application entitled "Method for Preparing Transparent Multilayer Film Structures Having a Perfluorinated Copolymer resin Layer" filed concurrently herewith.

The aminosilane coupling agent may be applied to the surface of the FEP film layer, preferably a surface that has been treated as described above, using any known technique including liquid phase (e.g., dip coating, spray coating, etc.) and gas phase (e.g., vapor deposition) techniques. Preferably, the aminosilane coupling agent may be applied as a liquid solution, generally a solution wherein the concentration of aminosilane is from 0.05 to 1% by weight. The aminosilane may be dissolved in a solution including a polar organic solvent and applied to a film using a dip coating technique, followed by drying to remove the solvent. The drying may occur at an elevated temperature, sufficient to drive off the liquid solvent. The polar organic solvent may be a low molecular weight alcohol, such as those having 8 or fewer, preferably 4 or fewer, carbon atoms, (e.g., methanol, ethanol, propanol, or isopropanol). The solution may include a mixture of a polar organic solvent and water. For example, a 0.1 weight % aminosilane solution may be applied using a solution of 95% ethanol in water, and then dried at a temperature of 100° C. A range of solution compositions and drying temperatures can be used, and the composition and drying temperature will depend on the particular aminosilane used in combination with the solvent chosen, as well as the surface characteristics of the second film layer and the perfluorinated copolymer resin film layer to which the second film layer will be adhered.

One can also appreciate that the aminosilane coupling agent may be applied to the surface of one side of the FEP film, or it may be applied to the surfaces of both sides of the FEP film.

The second film layer that is used to form the transparent multilayer film laminate prepared by the process of the invention comprises an organosilane modified copolymer. The copolymer comprises copolymerized units of an α-olefin and an ester of an ethylenically unsaturated acid. Because the transparent multilayer film laminate prepared is suitable for use as an integrated front sheet for a photovoltaic module, the second film layer is preferably able to function as an encapsulant layer.

Suitable α-olefins that comprise comonomers of the ester copolymer may include, but are not limited to, ethylene, propylene, 1-butene, 1-pentene, 1-hexene, 1-heptene, 3-methyl-1-butene, 4-methyl-1-pentene, and the like and combinations of two or more of such comonomers. Preferably, the α-olefin comonomer is ethylene.

Examples of esters of unsaturated carboxylic acids that are suitable comonomers include, but are not limited to, methyl acrylates, methyl methacrylates, ethyl acrylates, ethyl methacrylates, propyl acrylates, propyl methacrylates, isopropyl acrylates, isopropyl methacrylates, butyl acrylates, butyl methacrylates, isobutyl acrylates, isobutyl methacrylates, tert-butyl acrylates, tert-butyl methacrylates, octyl acrylates, octyl methacrylates, undecyl acrylates, undecyl methacrylates, octadecyl acrylates, octadecyl methacrylates, dodecyl acrylates, dodecyl methacrylates, 2-ethylhexyl acrylates, 2-ethylhexyl methacrylates, isobornyl acrylates, isobornyl methacrylates, lauryl acrylates, lauryl methacrylates, 2-hydroxyethyl acrylates, 2-hydroxyethyl methacrylates, glycidyl acrylates, glycidyl methacrylates, poly(ethylene glycol)acrylates, poly(ethylene glycol)methacrylates, poly(ethylene glycol) methyl ether acrylates, poly(ethylene glycol) methyl ether methacrylates, poly(ethylene glycol) behenyl ether acrylates, poly(ethylene glycol) behenyl ether methacrylates, poly(ethylene glycol) 4-nonylphenyl ether acrylates, poly(ethylene glycol) 4-nonylphenyl ether methacrylates, poly(ethylene glycol) phenyl ether acrylates, poly(ethylene glycol) phenyl ether methacrylates, dimethyl maleates, diethyl maleates, dibutyl maleates, dimethyl fumarates, diethyl fumarates, dibutyl fumarates, dimethyl fumarates, and combinations of two or more thereof. Preferably, the esters of unsaturated carboxylic acids are alkyl acrylates or alkyl methacrylates.

More preferably, the ester copolymer may be an ethylene/alkyl acrylate copolymer comprising copolymerized units of ethylene and copolymerized units of an alkyl acrylate. The alkyl moiety of the alkyl acrylate may contain 1 to 8 or 1 to 4 carbon atoms, such as methyl, ethyl, and branched or unbranched propyl, butyl, pentyl, and hexyl groups. Exemplary alkyl acrylates include, but are not limited to, methyl acrylate, ethyl acrylate, iso-butyl acrylate, and n-butyl acrylate. The polarity of the alkyl acrylate comonomer may be manipulated by changing the relative amount and identity of the alkyl group present in the comonomer. Similarly, a $C_1$-$C_6$ alkyl methacrylate comonomer may be used as a comonomer. Such comonomers include methyl methacrylate, ethyl methacrylate, i-butyl methacrylate, and n-butyl methacrylate. These copolymers may comprise 20 to 40, preferably 24 to 35, weight % of alkyl acrylate. A notable copolymer comprises copolymerized units of ethylene and copolymerized units of n-butyl acrylate.

The ethylene/alkyl acrylate copolymers and ethylene/alkyl methacrylate copolymers may have melt flow rates ranging from about 0.1 to about 200 g/10 minutes, as determined in accordance with ASTM D1238 at 190° C. and 2.16 kg, and therefore suitable ethylene/alkyl acrylate copolymers and ethylene/alkyl methacrylate copolymers can vary significantly in molecular weight.

The ester copolymer may be in the form of a single ethylene/alkyl acrylate copolymer, a single alkyl methacrylate copolymer, or a mixture of any two or more different ethylene/alkyl acrylate copolymers and/or ethylene alkyl methacrylate copolymers. Blends of at least one ethylene/alkyl acrylate copolymer and at least one ethylene/alkyl methacrylate copolymer are also contemplated.

The ethylene/alkyl acrylate copolymers and/or ethylene/alkyl methacrylate copolymers may be prepared by well known processes using either autoclave or tubular reactors. For example, the copolymerization can be conducted as a continuous process in an autoclave, where ethylene, the alkyl acrylate (or alkyl methacrylate), and optionally a solvent such as methanol (see U.S. Pat. No. 5,028,674) are fed continuously into a stirred autoclave such as the type disclosed in U.S. Pat. Nos. 2,897,183 and 4,351,931, together with an initiator. Alternatively, the ethylene/alkyl acrylate copolymer (or ethylene/alkyl methacrylate copolymer) may be prepared in a tubular reactor, according to the procedure described in the article "High Flexibility EMA Made from High Pressure Tubular Process" (Annual Technical Conference—Society of Plastics Engineers (2002), 60th (Vol. 2), 1832-1836). The ethylene/alkyl acrylate copolymer or ethylene/alkyl methacrylate copolymer also may be obtained in a high pressure, tubular reactor at elevated temperature with additional introduction of reactant comonomer along the tube. The ethylene/alkyl acrylate copolymer or ethylene/alkyl methacrylate copolymer also may be produced in a series of autoclave reactors wherein comonomer replacement is achieved by multiple zone introduction of reactant comonomer as taught in U.S. Pat. Nos. 3,350,372; 3,756,996; and 5,532,066.

Ethylene/alkyl acrylate copolymers useful herein include those available from E. I. du Pont de Nemours and Company under the tradename Elvaloy® AC resins.

The method for preparing multilayer films described herein involves modifiying an ester copolymer with an organosilane coupling agent to improve adhesion of the composition to the fluoropolymer film.

An organosilane coupling agent is a silane coupling agent that contains at least one carbon-silicon bond. Typically, the silicon atom is bonded to three hydrolysable groups, such as methoxy-, ethoxy-, chloro-, or acetoxy-, and an organoreactive group. Without being bound by any theory, the silane may bond to reactive moieties on the surface of the fluoropolymer via the hydrolysable groups and then either reacts with or physically entangles with a polymer or other organic material via the organoreactive group.

Organosilane coupling agents can be prepared with a wide variety of organoreactive groups. Some example of different types of organoreactive groups of organosilane coupling agents can include amino, benzylamino, methacrylate, vinylbenzylamino, epoxy, chloropropyl, melamine, vinyl, ureido, mercapto, disulfide, and tetrasulfido groups. An organosilane coupling agent can include a single type of organoreactive group, a mixture of two or more groups of the same type, a mixture of two or more different types of groups, or a combination thereof. An example of a silane coupling agent is [3-(methacryloyloxy)propyl]trimethoxysilane (MAOPTMS or 3-(trimethoxysilyl)propyl methacrylate). Preferably, the organosilane that is used to modify any of the above-described olefin copolymers may be an aminosilane coupling agent. Examples of aminosilanes that are useful as coupling agents in the process of the invention include 3-aminopropyltrimethoxysilane (APTMS), gamma-aminopropyltriethoxysilane (APTES), N,N'-bis[(3-trimethoxysilyl)propyl]ethylenediamine (dipodalAP), N-(2-aminoethyl)-3-aminopropyltrimethoxysilane (AEAPTMS) and N-2-(vinylbenzylamino)-ethyl-aminopropyltrimethoxysilane (SMAEAPTMS), notably APTMS, APTES and AEAPTMS.

In order to provide a modified ester copolymer composition, the silane coupling agent can be introduced into the polymer composition by a variety of techniques including melt blending or imbibing. Imbibing is a process of soaking pellets comprising the ester copolymer in the liquid silane coupling agent, optionally in the presence of solvent.

The amount of silane coupling agent that is mixed with the olefin ester copolymer will generally range from 0.05 to 2.0 weight percent based on the total weight of silane coupling agent and olefin ester copolymer. Preferably 0.08 to 0.8 weight percent silane coupling agent will be used, based on the total weight the silane coupling agent and olefin ester copolymer. More preferably 0.1 to 0.5 weight percent silane coupling agent will be present, based on the total weight of the silane coupling agent and olefin ester copolymer.

The composition used in the second film layer may further contain one or more additives, such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), dispersants, surfactants, chelating agents, coupling agents, reinforcement additives (e.g., glass fiber), and fillers.

In one step of the method of the invention, a surface of the first perfluorinated copolymer resin film layer that has been surface-modified is contacted with a surface of the second film layer. Contact is made in such a manner that the perfluorinated copolymer resin film layer and the second film layer are arranged in overlaying fashion. The resulting multilayer film structure (prior to adhesion by heat and optional pressure or vacuum) or multilayer film laminate (after the layers are adhered by heat and optional pressure or vacuum), i.e. multilayer overlay, may be used in a subsequent lamination step.

In the process of the invention, the first perfluorinated resin copolymer film layer and the second silane modified olefin ester film layer are adhered by the application of heat and optionally pressure or vacuum. Sufficient heat is applied to the multilayer film structure to reach a temperature above the softening temperature of the second film layer so that it softens and adheres to the first perfluorinated copolymer resin film layer. In addition, one or more other layers may be in contact with one or more of the first and/or second film layers. However, there are no layers intervening between the first and second film layers. Depending on the equipment used, lamination conditions, number of other layers present, and the like, it may be necessary to maintain the temperature at 10 to 30° C. higher than the softening temperature of the second film layer for a period of one to 10 minutes to achieve adhesion. Optionally, pressure or vacuum can be applied to the multilayer film structure during heating to ensure good contact between the layers.

In some embodiments, it may be desirable to effect adhesion by contacting the second film layer with the first perfluorinated copolymer resin film layer to form a multilayer film structure, applying heat and passing the multilayer film structure through a nip. For example, the multilayer film structure may be heated in an oven at about 80° C. to about 120° C., or about 90° C. to about 100° C., for about 20 to about 40 minutes, and thereafter, the heated multilayer film structure is passed through a set of nip rolls so that the air in the void spaces between the individual layers may be squeezed out, and the edge of the multilayer film structure sealed. This forms a multilayer film laminate. The multilayer film laminate at this stage may be referred to as a pre-press. The multilayer film laminate, or pre-press, may then be placed in an air autoclave where the temperature is raised to about 120° C. to about 160° C., or about 135° C. to about 160° C., at a pressure of about 100 to about 300 psi (about 6.9 to about 20.7 bar), or about 200 psi (13.8 bar). These conditions are maintained for about 15 to about 60 minutes, or about 20 to about 50 minutes, after which the air is cooled while no more air is added to the autoclave. After about 20 to about 40 minutes of cooling, the excess air pressure is vented and the laminated products are removed from the autoclave.

The multilayer film laminates may also be produced through non-autoclave processes. Such non-autoclave processes are disclosed, for example, in U.S. Pat. Nos. 3,234,062; 3,852,136; 4,341,576; 4,385,951; 4,398,979; 5,536,347; 5,853,516; 6,342,116; and 5,415,909, U.S. Patent Application Publication 2004/0182493; European Patent Publication 1235683 B1; and PCT International Publication Numbers WO9101880 and WO03057478. Generally, the non-autoclave processes include heating the pre-lamination assembly and the application of vacuum, pressure or both. For example, the assembly may be successively passed through heating ovens and nip rolls.

A vacuum laminator may be used to adhere the perfluorinated copolymer resin first film layer to the second film layer to provide a multilayer film laminate. The laminator comprises a platen base, on which the film layers are placed in overlaying fashion for lamination. The laminator also comprises an enclosure that covers and completely surrounds the platen base. The region enclosed by the platen and enclosure may be evacuated. The laminator also comprises a flexible bladder within the enclosure attached to the top inner surface of the enclosure, which may be inflated to a pressure greater than the pressure in the evacuated region. For example, the pressure above the bladder may be atmospheric and the laminate may be held under vacuum beneath the bladder to remove air. When the bladder is inflated, the flexible surface of the bladder is pushed from the top of the enclosure toward the platen and applies a surface pressure to the multilayer overlay to ensure a good thermal contact between the overlay and the platen. For lamination of the multilayer film structure, the laminator is preheated to a temperature above the softening temperature of the second film layer and held at that temperature throughout the lamination process.

One surface of the perfluorinated copolymer resin first film is placed in contact with the surface of the second film layer such that the second film layer is sandwiched between the platen and the first film layer. Other layers may be placed between the second film layer and the platen for adhesion to the second film layer. Heat-resistant sheets may be placed under the second film layer to retard heat flow and allow deaeration and devolatilization of the sample. Release sheets may be placed under the second film layer and/or over the first film layer to prevent the sample layers from adhering to parts of the laminator. The multilayer film structure is placed on the platen and the enclosure of the laminator is lowered into place and sealed. Next, the region surrounding the multilayer film structure between the platen and enclosure of the laminator is evacuated (e.g. to a pressure of 1 mbar) to help further with the prevention of voids, defects, and air pockets. Next, the rubber bladder is inflated (e.g. to a pressure of 999 mbar) so that it presses against the multilayer film structure and ensures good thermal contact with the platen. The pressure and heat are maintained for a sufficient period of time (for 1 to 10 minutes) to soften the second film layer and adhere it to the perfluorinated copolymer resin first film layer and, if present, any additional layer contacting the surface of the second film layer opposite the perfluorinated copolymer resin first film layer.

When the heating step is complete, the bladder is depressurized to 0 mbar so that it may be removed from contact with the multilayer film laminate, the enclosure is vented to atmospheric pressure and the enclosure is unsealed and opened.

The multilayer film laminate is removed from the platen and allowed to cool to room temperature.

With appropriate modifications, the lamination procedure can also be used to prepare photovoltaic modules including encapsulant layers, solar cell layers and/or backing layers as described below. The lamination methodology described here is by no means the only possible way to carry out such laminations. For example, more advanced laminators have retractable pins that hold the multilayer laminate structure above the heat source until the desired time to effect contact and heating. This would obviate the need for heat resistant layers in most cases.

The weatherable multilayer film laminate may be used as an integrated frontsheet for a photovoltaic module that provides all the properties necessary to protect the electrical components of the photovoltaic module provided by separate incident and encapsulant layers and can be attached directly to the solar cell layer of the module. The transparent multilayer film laminate prepared herein may be used as an integrated frontsheet wherein the perfluorinated copolymer resin film layer functions as the incident layer and the second film layer functions as an encapsulant layer.

Accordingly, the invention is directed to a method for forming a photovoltaic module that comprises the above-described method for preparing a transparent multilayer film laminate and also further comprises a step of overlaying a solar cell layer with the transparent multilayer film laminate prepared by the process of the invention. Photovoltaic modules, the solar cell layer, encapsulant layer and the additional layer or layers used in these methods are described in greater detail below.

In one embodiment a solar cell layer is contacted with the transparent multilayer film laminate in a manner such that the surface of the second film layer that is opposite that which contacts the first perfluorinated copolymer resin layer will contact the solar cell layer. In this embodiment, the area of the multilayer film laminate is larger than the area of the solar cell layer. Additionally, in this embodiment, those portions of the transparent multilayer film laminate that extend beyond the perimeter of the solar cell layer are positioned so as to contact an encapsulant layer that may be formed of the same or different material as the second film layer of the transparent multilayer film laminate. The transparent multilayer film laminate is then adhered to the solar cell layer and the encapsulant layer by the application of heat and optionally pressure or vacuum to form a photovoltaic module.

The solar cell layer may be significantly thicker than the other layers and irregular in shape and/or thickness, including spaces between and around the solar cells and other components of the solar cell layer. Therefore, portions of the second film layer of the transparent multilayer film laminate will contact the encapsulant layer outside the perimeter of the solar cell layer and can be adhered when heat is applied. As used herein, the perimeter of the solar cell layer is the outline of the outer limits of the area encompassed by the solar cell layer. In many cases, it is desirable that the second film layer and/or the encapsulant layer flow into the spaces and closely encapsulate the solar cells and other components to physically consolidate the photovoltaic module. Thus, it may be necessary to apply heat for a period of time sufficient to allow such flow, which may be longer than that needed for adhering thinner layers of a more regular shape. For example, heat may be applied in such a manner that the transparent multilayer film laminate is maintained above the softening point of the second film layer thereof or above the softening point of the additional encapsulant layer, whichever is higher, for 5 to 30 minutes to effectively consolidate the photovoltaic module.

The steps recited above may be accomplished using a vacuum lamination procedure similar to that described previously, with the modification that an encapsulant layer and a solar cell layer are included in a multilayer laminate structure with the transparent multilayer film structure that comprises the first perfluorinated copolymer resin film layer and the second film layer.

In many cases, photovoltaic modules may be prepared as described above, in which a transparent multilayer film laminate comprising a perfluorinated copolymer resin film layer and a second film layer is prepared (an integrated frontsheet), and subsequently assembled in combination with other layers into a photovoltaic module by application of heat and optionally pressure or vacuum.

Another embodiment includes contacting a surface of the second film layer with a perfluorinated copolymer resin film to form a film laminate structure, overlaying a solar cell layer with the film laminate structure such that the second film layer is positioned such that portions of the second film layer extend beyond the perimeter of the solar cell layer and contact an encapsulant layer and then applying heat and optionally pressure or vacuum to adhere the various layers to each other simultaneously.

The methods described above may also include those wherein an additional layer is adhered to the surface of the encapsulant layer opposite the surface that contacts portions of the surface of the second film layer. The additional layer may be adhered to the encapsulant layer prior to, simultaneously with, or subsequently to contacting and adhering the second film layer to the above-described encapsulant layer.

For example, the encapsulant layer may be part of an integrated backsheet in which the encapsulant layer is adhered to an additional layer prior to contacting and adhering to the second film layer. Alternatively, the encapsulant layer may be contacted with the second film layer of the transparent multilayer film laminate on one surface and another layer, such as a backsheet, on the opposite surface and adhered to both layers simultaneously, or the encapsulant layer may be adhered to the second film layer of the transparent multilayer film laminate and then adhered to another layer, such as a backsheet.

In some cases, the encapsulant layer may be also surface treated with an organosilane coupling agent such as an aminosilane to improve adhesion to the second film layer and/or the additional layer.

In any of these cases, the second film layer of the transparent multilayer film laminate may be part of an integrated frontsheet in combination with the first perfluorinated copolymer resin film layer, or the first perfluorinated copolymer resin film layer and second film layer may adhered at the same time that the second film layer of the transparent multilayer film laminate is adhered to the encapsulant layer.

The methods described above provide multilayer films and photovoltaic modules characterized by an average peel strength between the first film layer and the second film layer of greater than 2 lbf/in, measured after exposing the film or photovoltaic module to conditions of 85° C. and 85% relative humidity (damp heat) for 1000 hours. When the film or photovoltaic module contains an EVA layer, the EVA is crosslinked prior to exposure to damp heat.

In a typical module construction, the solar cell layer is sandwiched between two encapsulant layers, which are further sandwiched between the frontsheet (or incident layer) and backsheet layers. In the methods described herein, a film layer comprising a perfluorinated copolymer resin film composition of a transparent multilayer film laminate serves as the frontsheet of a photovoltaic module and the second film layer of the transparent multilayer film laminate serves as an encapsulant layer. The combination may be provided in the form of the transparent multilayer film laminate described herein, also known as an integrated front sheet. As previously described, the second film layer and an additional encapsulant layer sandwich the solar cell layer and another layer (a backsheet layer) may also be adhered to the additional encapsulant layer.

Monocrystalline silicon (c-Si), poly- or multi-crystalline silicon (poly-Si or mc-Si) and ribbon silicon are the materials used most commonly in forming the more traditional wafer-based solar cells. Photovoltaic modules derived from wafer-based solar cells often comprise a series of self-supporting wafers (or cells) that are soldered together. The wafers generally have a thickness of between about 180 and about 240 µm.

Thin film solar cells are commonly formed from materials that include amorphous silicon (a-Si), microcrystalline silicon (pc-Si), cadmium telluride (CdTe), copper indium selenide ($CuInSe_2$ or CIS), copper indium sulfide, copper indium/gallium diselenide ($CuIn_xGa_{(1-x)}Se_2$ or CIGS), copper indium/gallium disulfide, light absorbing dyes, and organic semiconductors. Thin film solar cells with a typical thickness of less than 2 µm are produced by depositing the semiconductor layers onto a superstrate or substrate formed of glass or a flexible film.

Photovoltaic modules prepared by the methods described herein include, but are not limited to, wafer-based solar modules (e.g., c-Si or mc-Si based solar cells, as described above) and thin film solar modules (e.g., a-Si, pc-Si, CdTe, CIS, CIGS, light absorbing dyes, or organic semiconductor based solar cells). Within the solar cell layer, the solar cells may be electrically interconnected and/or arranged in a flat plane. In addition, the solar cell layer may further comprise electrical wiring, such as cross ribbons and bus bars.

The polymeric materials used in the second film layer may be the same as, or different from, the polymeric material used in any optional additional encapsulant layer that may be present in the transparent multilayer film laminates and photovoltaic modules. Any optional additional encapsulant layers used in preparing transparent multilayer film and photovoltaic modules described herein may each comprise a polymeric material independently selected from the group consisting of olefin unsaturated carboxylic acid copolymers, ionomers of olefin unsaturated carboxylic acid copolymers, ethylene vinyl acetate copolymers, poly(vinyl acetals) (including acoustic grade poly(vinyl acetals)), polyurethanes, polyvinylchlorides, polyethylenes (e.g., linear low density polyethylenes), polyolefin block copolymer elastomers, copolymers of α-olefins and ethylenically unsaturated carboxylic acid esters (e.g., ethylene methyl acrylate copolymers and ethylene butyl acrylate copolymers), silicone elastomers, epoxy resins, and combinations of two or more thereof.

The optional encapsulant layer may preferably comprise a thermoplastic polymer selected from the group consisting of olefin unsaturated carboxylic acid copolymers, ionomers of olefin unsaturated carboxylic acid copolymers, and combinations thereof (for example, a combination of two or more olefin unsaturated carboxylic acid copolymers, a combination of two or more ionomers of olefin unsaturated carboxylic acid copolymers, or a combination of at least one unsaturated carboxylic acid copolymer with one or more ionomers of unsaturated carboxylic acid copolymers).

The olefin unsaturated carboxylic acid copolymers used herein may be copolymers of an α-olefin having 2 to 10 carbons and an α,β-ethylenically unsaturated carboxylic acid having 3 to 8 carbons. For example, the acid copolymer may comprise about 15 to about 30 weight % of copolymerized units of the α,β-ethylenically unsaturated carboxylic acid, based on the total weight of the copolymer.

Suitable α-olefin comonomers include, but are not limited to, ethylene, propylene, 1-butene, 1-pentene, 1-hexene, 1-heptene, 3-methyl-1-butene, 4-methyl-1-pentene, and the like and combinations of two or more of such comonomers. Preferably, the α-olefin is ethylene.

Suitable ethylenically unsaturated carboxylic acid comonomers include, but are not limited to, acrylic acids, methacrylic acids, itaconic acids, maleic acids, fumaric acids, monomethyl maleic acids, and combinations of two or more thereof. Preferably, the ethylenically unsaturated carboxylic acid is an α,β-ethylenically unsaturated acid selected from the group consisting of acrylic acids, methacrylic acids, and combinations of two or more thereof.

In certain embodiments, the acid copolymers will not comprise comonomers other than the α-olefins and the ethylenically unsaturated carboxylic acids. As such, the copolymers may be dipolymers of the acid copolymer comprising about 15 to about 30 weight % of copolymerized units of the ethylenically unsaturated carboxylic acid, based on the total weight of the copolymer, the remainder being an α-olefin, preferably ethylene.

Alternatively, the acid copolymers may further comprise copolymerized units of other comonomer(s) in addition to the ethylenically unsaturated carboxylic acid and the α-olefin, such as derivatives of unsaturated carboxylic acids having 2 to 10, or preferably 3 to 8 carbons. Suitable acid derivatives include acid anhydrides (such as maleic anhydride), amides, and esters. Preferably, the acid derivatives are esters. Specific examples of esters of unsaturated carboxylic acids include, but are not limited to the carboxylic acid esters described above for the ethylene ester copolymer. Preferably, the esters of unsaturated carboxylic acids are alkyl acrylates or alkyl methacrylates.

Ionomers of acid copolymers are ionic, neutralized derivatives of precursor acid copolymers, such as those acid copolymers disclosed above. Ionomers of unsaturated carboxylic acid copolymers may be produced by neutralizing the acid groups of the precursor acid copolymers with a reactant that is a source of metal ions in an amount such that neutralization of about 10% to about 60%, or about 20% to about 55%, or about 35% to about 50% of the carboxylic acid groups takes place, based on the total carboxylic acid content of the precursor-unsaturated carboxylic acid copolymers as calculated or measured for the non-neutralized precursor acid copolymers. Neutralization may often be accomplished by reaction of the precursor acid polymer with a base, such as sodium hydroxide, potassium hydroxide, or zinc oxide.

The metal ions may be monovalent ions, divalent ions, trivalent ions, multivalent ions, or combinations of two or more thereof. Useful monovalent metallic ions include but are not limited to sodium, potassium, and lithium. Useful divalent metallic ions include but are not limited to beryllium, magnesium, calcium, strontium, barium, copper, iron, cobalt, and zinc. Useful trivalent metallic ions include but are not limited to aluminum, scandium, iron, and yttrium. Useful multivalent metallic ions include but are not limited to titanium, zirconium, hafnium, vanadium, tantalum, tungsten, cerium, and iron. When the metallic ion is multivalent, complexing agents such as stearate, oleate, salicylate, and phenolate radicals may be included, as disclosed in U.S. Pat. No. 3,404,134. Preferably, the metal ions are monovalent or divalent metal ions, such as metal ions selected from the group consisting of sodium, lithium, magnesium, zinc, potassium and combinations of two or more thereof. Notably, the metal ions are selected from sodium, zinc, and combinations thereof. For example, the metal ion is zinc.

Ionomers useful herein include those available from DuPont under the tradename Surlyn® resins.

The compositions used in any optional additional encapsulant layer can also include copolymers, especially dipolymers, that comprise copolymerized units of ethylene and from about 5 to about 15% by weight of monoesters or diesters of $C_4$-$C_8$ unsaturated acids having at least two carboxylic acid groups (e.g. in the case of monoesters those diacids wherein one carboxyl group is esterified and the other is a carboxylic acid group) such as ethylene maleic acid monoester copolymers. Preferably, when the composition includes a monoester, the monoester comprises about 6 weight % to about 15 weight % of the random copolymerized units of the copolymer chain.

Examples of useful monoester comonomers include maleic acid monoesters, fumaric acid monoesters, citraconic acid monoesters and mixtures thereof. Maleic acid monoesters are also known as maleic half-esters or alkyl hydrogen maleates.

Copolymers of ethylene and maleic acid monoesters, more preferably maleic acid $C_1$-$C_4$ alkyl monoesters such as, for example, methyl, ethyl, n-propyl, isopropyl, and n-butyl monoesters are highly preferred, and copolymers of ethylene and maleic acid monoethyl ester (i.e. ethyl hydrogen maleate) are most preferred.

Also suitable for use in the second layer and/or optional encapsulant layer are terpolymers comprising copolymerized units of ethylene; copolymerized units of a first polar comonomer selected from the group consisting of $C_1$-$C_4$ alkyl esters of butenedioic acids, such as mono and diesters of maleic acid; and copolymerized units of a second polar comononer selected from the group consisting of vinyl acetate, $C_1$-$C_4$ alkyl acrylates and $C_1$-$C_4$ alkyl methacrylates. Preferred terpolymers include those having less than 10 weight % copolymerized units of the second polar comonomer, based on the weight of the terpolymer. Preferably, less than 5 weight % copolymerized units of the second polar comonomer will be present, based on the weight of the terpolymer. Preferred monomers suitable for use as the second polar comonomer in the above-described terpolymer are acrylic acid esters and methacrylic acid esters of $C_1$ to $O_4$ alcohols. Methyl acrylate and butyl acrylate are particularly preferred examples of the second comonomer.

These ethylene dicarboxylic acid monoester and diester copolymers are obtained by a process of high-pressure free radical polymerization. They are direct or random copolymers, that is, copolymers polymerized by adding all monomers simultaneously. A high-pressure process suitable for preparing such copolymers is described, for example, in U.S. Pat. No. 4,351,931. This process provides mixtures of comonomers that react with each other to form the polymer chain to provide random copolymers having copolymerized units of all comonomers incorporated into the polymer backbone or chain.

The composition of the encapsulant layer may comprise an ethylene/vinyl acetate copolymer comprising copolymerized units of ethylene and vinyl acetate. These copolymers may comprise 25 to 35, preferably 28 to 33, weight % of vinyl acetate. The ethylene/vinyl acetate copolymer may MFR of about 0.1 to about 1000 g/10 minutes, or about 0.3 to about 30 g/10 minutes, as determined in accordance with ASTM D1238 at 190° C. and 2.16 kg.

The ethylene vinyl acetate copolymer used in the encapsulant layer composition may be in the form of a single ethylene/vinyl acetate copolymer or a mixture of two or more different ethylene/vinyl acetate copolymers. By different ethylene/vinyl acetate copolymers is meant, for example, that the copolymers have different comonomer ratios. They may also be copolymers that have the same comonomer ratios, but different MFR due to having different molecular weight distributions.

Ethylene/vinyl acetate copolymers useful herein include those available from E. I. du Pont de Nemours and Company (DuPont), Wilmington, Del. under the tradename Elvax® resins.

Alternatively, the encapsulant layer may comprise an ethylene/alkyl acrylate copolymer comprising copolymerized units of ethylene and an alkyl acrylate or an alkyl methacrylate such as described above for the second film layer.

The composition used in the encapsulant layer may further contain one or more additives, such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), silane coupling agents (described in greater detail above), dispersants, surfactants, chelating agents, coupling agents, reinforcement additives (e.g., glass fiber), and fillers. Ethylene vinyl acetate copolymer compositions also frequently contain crosslinking agents such as organic peroxides. Any of these additives are generally present in amounts of no more than 20 weight % of the encapsulant composition, sometimes no more than 10 weight % and sometimes no more than 2 weight %.

Suitable backsheet layers comprise polymers that include but are not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, silicones, poly(vinyl chlorides) (e.g., poly(vinylidene chloride)), fluoropolymers (e.g., polyvinyl fluoride, polyvinylidene fluoride, polytetrafluoroethylene, and ethylene-tetrafluoroethylene copolymers), and combinations of two or more thereof. The polymeric film may be non-oriented, or uniaxially oriented, or biaxially oriented. A multilayer film of polyester (PET) sandwiched between two layers of polyvinyl fluoride (PVF) is a specific example of a backsheet. Although a multilayer film comprising a perfluorinated copolymer film layer adhered to an aminosilane surface-treated second film layer prepared as described herein has been described above as an integrated frontsheet, it may alternatively be used as an integrated backsheet. When used as an integrated backsheet, such a transparent multilayer film laminate may be used in combination with a similar or identical transparent multilayer film laminate used as an integrated frontsheet or with frontsheets and/or encapsulant layers of different compositions.

In some embodiments, bifacial modules receive incident light from both sides of the device, incorporating a transparent layer on both front and back. For example, a transparent multilayer film laminate as described herein may be used as a first frontsheet of a bifacial device, while a glass layer is used as a transparent backsheet. Alternatively for a flexible bifacial module, transparent multilayer film laminates as described herein may be used on both sides of the device, in which the compositions of each sheet may be the same or different. For example, an FEP transparent layer may be used as a frontsheet on one side of the device with an ETFE transparent layer of the prior art used on the other side of the device, or FEP layers may be used on both sides of the device.

The photovoltaic module may further comprise other functional film or sheet layers (e.g., dielectric layers or barrier layers) embedded within the module. For example, poly(ethylene terephthalate) films coated with a metal oxide coating, such as those disclosed in U.S. Pat. Nos. 6,521,825 and 6,818,819 and European Patent EP1182710, may function as oxygen and moisture barrier layers in the transparent multilayer film laminates or photovoltaic modules.

If desired, a layer of fiber (scrim) may also be included between the solar cell layers and encapsulant layers to facilitate deaeration during the lamination process or to serve as reinforcement for the encapsulant layers. The fiber may be a woven or nonwoven glass fiber or a networked mat of connected fibers. The use of such scrim layers is disclosed in, e.g., U.S. Pat. Nos. 5,583,057; 6,075,202; 6,204,443; 6,320,115; and 6,323,416 and European Patent EP0769818.

Any of the foregoing embodiments of photovoltaic modules may be prepared using the methods described herein.

The invention has been described with reference to specific embodiments. However, one of ordinary skill in the art appreciates that one or more modifications or one or more other changes can be made without departing from the scope of the invention as set forth in the claims below. Accordingly, the specification is to be regarded in an illustrative rather than a restrictive sense and any and all such modifications and other changes are intended to be included within the scope of invention.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any sub-combination.

The invention is further described in specific embodiments in the Examples, wherein all amounts are expressed as parts by weight or weight percentages unless otherwise stated.

EXAMPLES

Materials Used

EBA-1: an ethylene/n-butyl acrylate dipolymer (27 weight copolymerized n-butyl acrylate units), melt flow rate 4 g/10 minutes(190° C., 2.16 kg), as determined according to ASTM D1238.

APTMS: 3-aminopropyltrimethoxysilane, available from Sigma-Aldrich Co.

MAOTMS: methacryloyloxypropyltrimethoxysilane, available from Sigma-Aldrich Co.

FEP-1: A film, corona treated on one side, comprising a tetrafluoroethylene-hexafluoropropylene copolymer (7.2 to 8.1 weight copolymerized units of HFP, 1.5 to 1.8 weight % copolymerized units of PEVE and 90.1 to 91.3 weight % copolymerized units of TFE), nominal melt flow rate 6 to 8 gm/10 minutes as defined in ASTM D2116 and melting between 260 and 270° C., designated as PV3151, available from DuPont.

ETFE-1: A film, corona treated on one side, comprising an ethylene-tetrafluoroethylene copolymer (76.5 to 80.1 weight % copolymerized units of TFE, 17.8 to 19.6 weight % copolymerized units ethylene and 2.1 to 3.9 weight % copolymerized units of PFBE), designated as PV3251, available from DuPont.

Polymer compositions described below were prepared by mixing polymer pellets with liquid additives and permitting the pellets to imbibe the additives. The modified pellets were fed to a twin screw extruder for preparing extruded polymer sheet compositions.

Sheets were formed by extrusion casting. The melt processing temperature was approximately 175° C. to 180° C. Modified polymer pellets containing imbibed liquid additives were fed to an extruder, melted, conveyed, and forced through a suitably shaped die (e.g., a linear slot die) to produce the desired cross-sectional sheet shape. The extruding force was exerted by twin 28 mm diameter counter-rotating screws (twin screw extrusion), which operated within a closely fitted chamber in which the material was heated and plasticized and from which it was extruded through the die in a continuous flow. The modified polymer pellet compositions were extruded through a 0.020 inch×10 inch slot die. After extrusion through the die, the polymeric sheet was cast onto a water-cooled chilled roll for solidification. The thus-produced sheet was collected and wound onto cardboard cores. Compositions and extrusion conditions are summarized in Table 1.

TABLE 1

|  | EBA-1 | MAOTMS-modified EBA-1 | APTMS-modified EBA-1 |
|---|---|---|---|
| EBA-1 | 100% | 99.6 parts | 99.6 parts |
| Silane Additive | None | 0.4 parts MAOTMS | 0.4 parts APTMS |
| Extruder Feed Barrel Temperature | 122 | 129 | 125 |
| Extruder Zone 1 Temperature | 154 | 162 | 159 |
| Extruder Zone 2 Temperature | 174 | 169 | 175 |
| Extruder Zone 3 Temperature | 176 | 176 | 172 |
| Extruder Zone 4 Temperature | 171 | 173 | 175 |
| Extruder Die Temperature | 175 | 172 | 172 |
| Feed (pph) | 4 | 3 | 3 |
| Screw speed (RPM) | 100 | 80 | 80 |
| Die Gap (in) | 0.02 | 0.02 | 0.02 |
| Chill roll cooling water (°C.) | 14 | 30 | 30 |
| Windup Speed (fpm) | 2 | 2 | 2 |
| Film thickness (in) | 0.015 | 0.018 | 0.018 |

Commercially available films of FEP-1 and ETFE-1 as received from the manufacturer were used in the laminations. For some examples, the fluoropolymer films were also treated with an aminosilane according to the following procedure.

Preparation of Aminosilane Solution

An aminosilane solution was prepared by mixing 95 parts by weight ethanol, 5 parts by weight water and 0.1 parts by weight 3-aminopropyltrimethoxysilane (APTMS). The ethanol and water portions are available as a premixed solvent, "Ethanol for Molecular Biology, 190 Proof" from Sigma/Aldrich Co.

Surface Treatment Method

Samples of FEP-1 or ETFE-1 were attached with metal paper clips to a PTFE (Teflon® fluoropolymer resin) plate substrate for support. The surface of the film that was to be treated with aminosilane solution was oriented to face outward, away from the Teflon® fluoropolymer resin support plate. The film and supporting substrate assembly were immersed in the aminosilane solution for five minutes. The film and supporting substrate were then removed from the solution and rinsed thoroughly with isopropyl alcohol. After rinsing was complete, the entire assembly was blown dry with a stream of nitrogen. To remove any remaining solvent, the assembly was placed in a convection oven set at 100° C. for 30 minutes. Dried films were available for immediate lamination or stored for later lamination.

Lamination Method

For adhesion strength testing, the film samples were laminated to perfluorinated copolymer resin film and a foil substrate.

A laminator with a platen, enclosure and bladder was used to laminate the films. Samples consisted of an aluminum foil substrate, a sample sheet, and a flexible top sheet. Example sheets were prepared from the silane-modified EBA-1. The flexible top sheet was a perfluorinated copolymer resin film that had been corona treated prior to lamination or both corona treated and surface treated with aminosilane using the method described above. Comparative Example samples consisted of an aluminum foil substrate, a sample sheet and a flexible top sheet. The Comparative Example laminations included laminates wherein the fluoropolymer layer was formed of ETFE instead of FEP and laminates that were prepared from EBA-1 compositions that did not contain imbibed organosilane additive.

Multilayer test structures were assembled at room temperature. A surface of an EBA-1 film (EBA-1 containing imbibed organosilane in the Example films) was placed in contact with a corona-treated surface of a fluoropolymer film (perfluorinated copolymer resin film for examples of the invention or ETFE-1 film for some comparative examples) such that the EBA-1 film was sandwiched between the foil and the fluoropolymer film.

The laminated area of the samples was 8 inches by 8 inches. A small piece of polyester slip sheet was placed between the fluoropolymer film and the EBA-1 film at one end of the overlay to provide an unlaminated (unadhered) region to serve as an initiation point for subsequent peel tests. After assembly of a test sample, it was placed atop an untreated 10 mil thick Teflon® FEP 1000A release film sheet positioned such that the foil layer contacted the release sheet. Five heat resistant layers made of Sontara® Z-11 spunlaced fabric comprising Kevlar® aramid fibers (1.8-2.0 oz/yard, available from DuPont (Wilmington, Del.) were positioned below the release sheet. Another 10 mil Teflon® FEP 1000A release sheet was placed atop the resultant test sample. The purpose of the heat resistant layers was to slow the heating rate during the lamination so that the sample layer was not softened before all the air could escape from between the film layer interfaces, thereby avoiding formation of air pockets and other defects. The release sheets prevented any material that might flow from the multilayer laminate structure from adhering to parts of the laminator.

The assembly consisting of multilayer film laminate, heat resistant layers and Teflon® FEP 1000A release sheets was then placed onto the platen with the foil facing the platen, which was preheated to a temperature of 150° C. and maintained at 150° C. throughout the lamination process. Immediately after placing the assembly on the platen, the enclosure of the laminator was lowered into place, sealed and the region surrounding the sample between the platen and enclosure of the laminator was evacuated over approximately six minutes to a pressure of 1 mbar to further assist in prevention of voids, defects, and air pockets. The rubber bladder was then inflated over a period of approximately one minute to a pressure of 999 mbar to provide pressure on the sample and other layers and ensure good thermal contact with the platen. The enclosure pressure (1 mbar), bladder pressure (999 mbar), and the temperature of the platen (150° C.) were held constant for approximately 13 minutes or longer, depending on the sample composition and number of heat resistant layers. The heating insured that the EBA-1 film was softened so that it was in intimate conforming contact with the surface of the fluoropolymer film. The resulting multilayer film laminates were tested for interlayer adhesion as described below.

Samples prepared for light transmission testing were similarly prepared using EBA-1 organosilane modified films, except that the opaque foil substrate was replaced with FEP film that had not been corona treated and did not adhere to the sample surface of the EBA-1 layer. Sample size was 4 inches by four inches. Four sheets of Sontara® Z-11 spunlaced fabric were placed between the bottom platen and each sample to slow the heating rate. Samples were positioned such that the fluoropolymer frontsheet faced down (toward the platen) and the removable (untreated ETFE fluoropolymer backsheet faced up (toward the bladder). Glass plates contacted the sample on the top and bottom sides to maintain flatness. The lamination process was conducted under conditions of a 4-minute evacuation period, 1-minute pressurization period, and a 30 minute hold period to accommodate heating of the glass plates.

Following the lamination step, the Teflon® FEP 1000A release film sheet was easily removed to provide a transparent 2-layer laminate of the fluoropolymer frontsheet adhered to the surface-treated second film layer. Comparative Example multilayer film laminates were prepared using ETFE-1 instead of FEP-1 as the fluoropolymer film layer.

Test Methods

Damp Heat Exposure

Multilayer film laminate samples were placed, suspended vertically from a shelf by clips, in a laboratory oven capable of providing controlled heat and humidity. The oven was then brought to a temperature of 85° C. and relative humidity of 85%. During the duration of the test, the oven was maintained in a darkened state (i.e. no internal illumination sources were used, although some light may have entered through the observation window from the exterior of the oven). These conditions were maintained for a specified number of hours. Samples were removed and tested after exposures of 500 hours and 1000 hours to estimate suitability for use in photovoltaic applications. In many photovoltaic module applications 1000 hours at 85° C. and 85% relative humidity is the required qualification standard.

Peel Strength

Samples were prepared by passing a blade through the multilayer film laminate in a manner such that the fluoropolymer top sheet, the EBA-1 layer, and the foil backing layer of the laminate were sequentially cut. Parallel cuts were made that were separated by one inch. This provided 3-layer laminate samples that were one inch wide. The one-inch sections of the sample were cut so that the one inch width was parallel to the longest dimension of the fluoropolymer resin top sheet and the samples were taken from the interior of the laminated (adhered) region, not from areas near the edges of the laminated region. The cuts ran from the laminated region through the unlaminated section of the fluorinated resin sheet provided by the polyester slip sheet discussed above. The peel test used the boundary between the laminated and unlaminated areas of the sample as the initiation point for the peel test. Test samples of Example laminates and Comparative Example laminates were prepared similarly.

The multilayer laminated film samples were tested using a T-peel test according to the procedures of ASTM F904-91 "Standard Test Method For Comparison Of Bond Strength Of Ply Adhesion Of Similar Laminates Made From Flexible Materials". The average force during the constant steady-state peel propagation is reported. Peel strength data were recorded only for clean peels wherein the fluoropolymer layer peeled away completely from the EBA-1 layer and foil layers. In cases wherein the laminate fluoropolymer layer broke before peeling occurred, or when the EBA-1 layer remained adhered to the fluoropolymer layer and peeled away instead from the foil layer, no results were recorded.

Two multilayer film laminates were tested for each Example and Comparative Example composition and for each exposure condition. As many as three one inch width peel tests were performed for each laminate. Peel strengths reported in Tables 2 and 3 represent an average value for up to fifteen tests per Example (five peels for each time point: the initial condition prior to damp heat treatment, after 500 hours damp heat treatment and after 1000 hours damp heat treatment). Results for lamination to ETFE-1 are reported in Table 2. Results for lamination to corona-treated FEP-1 are reported in Table 3 and results for lamination to FEP-1 that had been corona-treated and silane surface-treated are reported in Table 4.

TABLE 2

Adhesion to ETFE-1 Film After Exposure (lbf/in)

| Comparative Example | Sample Composition | Damp Heat Exposure Time | | | | | |
|---|---|---|---|---|---|---|---|
| | | 0 hr | | 500 hr | | 1120 hr | |
| | | Ave | SD | Ave | SD | Ave | SD |
| C1 | EBA-1 | 6.12 | 0.76 | 0.429 | 0.092 | 5.381 | 3.366 |
| C2 | MAOTMS-modified EBA-1 | 11.82 | 0.609 | 14.827 | 0.677 | 7.766 | 2.715 |
| C3 | APTMS-modified EBA-1 | 0.607 | 0.648 | 12.405 | 1.68 | 14.6 | 1.404 |

TABLE 3

Adhesion to FEP-1 Film After Exposure (lbf/in)

| Sample | Composition | Damp Heat Exposure Time | | | | | |
|---|---|---|---|---|---|---|---|
| | | 0 hr | | 500 hr | | 1120 hr | |
| | | Ave | SD | Ave | SD | Ave | SD |
| Comparative Example C4 | EBA-1 | 1.445 | 0.182 | 0.011 | 0.004 | 1.535 | 0.122 |
| Example 1 | MAOTMS-modified EBA-1 | 0.29 | 0.064 | 4.807 | 0.983 | 2.284 | 0.234 |
| Example 2 | APTMS-modified EBA-1 | 2.35 | 0.568 | NA | NA | 8.015 | 0.847 |

TABLE 4

Adhesion to Aminosilane-treated FEP-1 Film After Exposure (lbf/in)

| Sample | Composition | Damp Heat Exposure Time | | | | | |
|---|---|---|---|---|---|---|---|
| | | 0 hr | | 500 hr | | 1120 hr | |
| | | Ave | SD | Ave | SD | Ave | SD |
| Comparative Example C5 | EBA-1 | 6.03 | 2.409 | 13.904 | 2.202 | 1.551 | 0.065 |
| Example 3 | MAOTMS-modified EBA-1 | 4.348 | 0.715 | 9.730 | 1.034 | 3.336 | 1.01 |
| Example 4 | APTMS-modified EBA-1 | 0.776 | 0.180 | 8.45 | 0.505 | 8.346 | 0.383 |

Examples 5 and 6 and Comparative Examples C6 and C7

Light Transmission

A two layer laminate (Example 5) was prepared that was composed of a layer of MAOTMS-modified EBA-1 and a layer of FEP-1. Lamination was conducted according to the above-described lamination method.

Similarly, two-layer laminates of the following structures were prepared: MAOTMS-modified EBA-1/ETFE-1 (Comparative Example C6); APTMS-modified EBA-1/FEP-1 (Example 6); and APTMS-modified EBA-1/ETFE-1 (Comparative Example C7). In these comparisons, the multilayer film laminates of this invention and the comparison standard laminates have the same structure and composition with the exception that the first film layer of the comparison standard laminate comprises an ethylene tetrafluoroethylene copolymer resin, the compositions of the first layers of the multilayer film laminate and the comparison standard laminate being otherwise identical. Light transmission properties of the two-layer laminates were tested using the method described below and reported in Table 5.

Light Transmission Method

Light transmittance spectra were collected in accordance with ASTM E424, Solar Energy Transmittance and Reflectance (Terrestrial) of Sheet Materials, Method A, for spectrophotometric determinations. This method compares the light transmitted through a specimen to that transmitted through air (paragraph 6.4.1) using an integrating sphere spectrophotometer (paragraph 6.1.1). Total solar energy transmittance for a sample, in percent, can be determined by integrating the spectral transmittance over the standard solar energy distribution by multiplying the transmittance at a given wavelength by energy weighted ordinates (paragraph 6.5.1). Essentially equivalent results (paragraph 1.1) can be obtained by Method B, using the sun as a light source and a pyranometer as a detector (paragraph 4.2).

For the study reported herein, light transmission data were determined using a Varian Cary 5000 UV/VIS/NIR spectrophotometer (version 1.12) equipped with a DRA-2500 diffuse reflectance accessory, scanning from 2500 nm to 200 nm int nm increments, averaging for 0.2 second over each increment, utilizing full slit height and operating in double beam mode. The DRA-2500 is a 150 mm integrating sphere with a SPECTRALON reflective coating. A total transmittance spectrum was obtained for each sample. Light transmission levels for selected wavelengths of the samples are reported in Table 5 as a percentage of transmission compared to the light transmitted through air.

TABLE 5

| | Light Transmission Level at Selected Wavelengths (%) | | | |
|---|---|---|---|---|
| | MAOTMS-modified EBA-1 | | APTMS-modified EBA-1 | |
| | on FEP-1 Example 5 | on ETFE-1 Comparative Example C6 | on FEP-1 Example 6 | on ETFE-1 Comparative Example C7 |
| 300 | 64.1 | 53.5 | 56.5 | 44.5 |
| 400 | 80.4 | 73.5 | 78.3 | 70.2 |
| 500 | 86.6 | 81.4 | 85.6 | 79.4 |
| 600 | 89.2 | 85.2 | 88.6 | 83.8 |
| 700 | 90.6 | 87.4 | 90.1 | 86.2 |
| 800 | 91.5 | 88.6 | 91.2 | 87.9 |

Multilayer film laminates that contained an FEP-1 layer had significantly better light transmission than Comparative Example multilayer film laminates that contained an ETFE-1 layer. This was the case at all wavelengths from 400 to 800 nm.

What is claimed is:

1. A method for preparing a transparent multilayer film laminate comprising at least a first film layer and a second film layer, the method comprising:
   A. providing a first film layer comprising a perfluorinated copolymer resin composition wherein i) the perfluorinated copolymer resin consists essentially of copolymerized units of tetrafluoroethylene and at least one perfluorinated comonomer at least one surface of the first film layer has been modified by a surface treatment;
   B. providing a second film layer comprising a polymeric material comprising a blend of i) an organosilane and ii) a copolymer comprising copolymerized units of an α-olefin and an ethylenically unsaturated carboxylic acid ester;
   C. contacting a surface of the second film layer with the modified surface of the first film layer; and
   D. adhering the first film layer to the second film layer by the application of heat and optionally pressure or vacuum to form a multilayer film laminate;
   wherein the multilayer film laminate is characterized by (i) having an average peel strength between the first film layer and the second film layer of greater than 2 lbf/in, measured after exposing the multilayer film laminate to conditions of 85° C. and 85% relative humidity for 1000 hours; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical.

2. A method of claim 1 wherein the ester copolymer comprises copolymerized units of ethylene and copolymerized units of an alkyl acrylate, an alkyl methacrylate or combinations thereof.

3. A method of claim 2 wherein the ester copolymer comprises copolymerized units of an alkyl acrylate.

4. A method of claim 3 wherein the alkyl acrylate is butyl acrylate.

5. A method of claim 1 wherein the organosilane is an aminosilane.

6. A method of claim 1 wherein the modified surface of the first film layer is treated with an aminosilane prior to contacting the surface of the second film layer.

7. A method for preparing a photovoltaic module, the method comprising the steps:
   A. providing a solar cell layer;
   B. providing a transparent multilayer film laminate that is larger in area than the solar cell layer, the multilayer film laminate comprising at least a first film layer and a second film layer, wherein ;
      1. the first film layer comprises a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;
      2. the second film layer comprises a polymeric material comprising a blend of i) an organosilane and ii) a copolymer comprising copolymerized units of an α-olefin and an ethylenically unsaturated carboxylic acid ester; and
      3. wherein the multilayer film laminate is characterized by (i) having an average peel strength between the first film layer and the second film layer of greater than 2 lbf/in, measured after exposing the multilayer film laminate to conditions of 85° C. and 85% relative humidity for 1000 hours; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical;
   C. overlaying the solar cell layer with the multilayer film laminate such that
      1. a surface of the second film layer of the multilayer film laminate contacts the solar cell layer;
      2. a portion of the second film layer of the multilayer film laminate extends beyond the perimeter of the solar cell layer; and
      3. the portion of the second film layer of the multilayer film laminate that extends beyond the perimeter of the solar cell layer contacts another layer that is an encapsulant layer; and
   D. adhering the second film layer of the multilayer film laminate to the solar cell layer and the encapsulant layer by the application of heat and optionally pressure or vacuum to provide a photovoltaic module.

8. A method of claim 7 wherein the encapsulant layer comprises a polymeric material selected from the group consisting of ethylene ethylenenically unsaturated acid copolymers, ionomers of ethylene ethylenenically unsaturated acid copolymers, ethylene vinyl acetate copolymers, poly(vinyl acetals), polyurethanes, polyvinylchlorides, polyethylenes, polyolefin block copolymer elastomers, copolymers of α-olefins and ethylenically unsaturated carboxylic acid esters, silicone elastomers, epoxy resins, and combinations of two or more thereof.

9. The method of claim 7 wherein an additional layer is adhered to the surface of the encapsulant layer opposite the surface that contacts portions of the surface of the second film layer.

10. A method for preparing a photovoltaic module comprising a multilayer laminate, the method comprising the steps:
   A. providing a solar cell layer;
   B. providing a first film layer comprising a perfluorinated copolymer resin composition wherein i) the perfluorinated copolymer resin consists essentially of copolymerized units of tetrafluoroethylene and at least one perfluorinated comonomer and ii) at least one surface of the first film layer has been modified by a surface treatment;
   C. providing a second film layer having an upper and lower surface, the second film layer being larger in area than the solar cell layer, wherein the second film layer comprises a polymeric material comprising a blend of i) an organosilane and ii) a copolymer comprising copolymerized units of an α-olefin and an ethylenically unsaturated carboxylic acid ester;
   D. contacting a modified surface of the first film layer with the upper surface of the second film layer;
   E. contacting the solar cell layer with the second film layer such that
      1. the lower surface of the second film layer contacts the solar cell layer;
      2. a portion of the second film layer extends beyond the perimeter of the solar cell layer; and
      3. the portion of the second film layer that extends beyond the perimeter of the solar cell layer contacts another layer that is an encapsulant layer; and
   F. adhering the second film layer to the first film layer and to the encapsulant layer by the application of heat and optionally pressure or vacuum to provide a photovoltaic module;

wherein the multilayer film laminate is characterized by (i) having an average peel strength between the first film layer and the second film layer of greater than 2 lbf/in, measured after exposing the multilayer film laminate to conditions of 85° C. and 85% relative humidity for 1000 hours with the proviso that when the encapsulant layer comprises an ethylene vinyl acetate copolymer, the multilayer film laminate is maintained at a sufficient temperature for a time sufficient to crosslink the ethylene vinyl acetate copolymer prior to exposing the multilayer film laminate to conditions of 85° C. and 85% relative humidity for 1000 hours; and (ii) having a light transmission level, as a percentage of the light transmitted through air at wavelengths from 400 to 800 nm, as determined according to methods in ASTM E424, that exceeds that of a comparison standard laminate wherein the multilayer film laminate and the comparison standard laminate have the same structure and composition with the exception that the first film layer of the comparison standard laminate comprises an ethylene tetrafluoroethylene copolymer resin, the compositions of the first film layers of the multilayer film laminate and the comparison standard laminate being otherwise identical.

11. The method of claim 10 wherein the ester copolymer comprises copolymerized units of ethylene and copolymerized units of an alkyl acrylate, an alkyl methacrylate or combinations thereof.

12. The method of claim 11 wherein the ester copolymer comprises copolymerized units of an alkyl acrylate.

13. The method of claim 12 wherein the alkyl acrylate is butyl acrylate.

14. The method of claim 10 wherein the organosilane is an aminosilane.

15. The method of claim 10 wherein the modified surface of the first film layer is treated with an aminosilane prior to contacting the surface of the second layer.

16. The method of claim 10 wherein an additional layer is adhered to the surface of the encapsulant layer opposite the surface that contacts portions of the surface of the second layer.

* * * * *